United States Patent
Ryu et al.

(10) Patent No.: US 10,262,965 B2
(45) Date of Patent: Apr. 16, 2019

(54) DISPLAY DEVICE AND MANUFACTURING METHOD THEREOF

(71) Applicant: Samsung Display Co., Ltd., Yongin-si, Gyeonggi-do (KR)

(72) Inventors: Seung-Soo Ryu, Hwaseong-si (KR); Jeong Do Yang, Yongin-si (KR); Jung Yun Jo, Namyangju-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/616,639

(22) Filed: Jun. 7, 2017

(65) Prior Publication Data

US 2018/0019220 A1 Jan. 18, 2018

(30) Foreign Application Priority Data

Jul. 15, 2016 (KR) .......................... 10-2016-0089859

(51) Int. Cl.
*H01L 23/00* (2006.01)
*H01L 23/498* (2006.01)
(Continued)

(52) U.S. Cl.
CPC .......... *H01L 24/13* (2013.01); *G02F 1/13454* (2013.01); *H01L 21/4853* (2013.01);
(Continued)

(58) Field of Classification Search
CPC ......... H01L 24/11; H01L 24/13; H01L 24/15; H01L 24/16; H01L 21/4853;
(Continued)

(56) References Cited

U.S. PATENT DOCUMENTS 8,035,226 B1 * 10/2011 Wilcoxen ............ H01L 23/3192
257/737
2007/0045841 A1 * 3/2007 Cho .................... H01L 23/3171
257/737

(Continued)

FOREIGN PATENT DOCUMENTS

JP 4355960 8/2009
JP 2012-79956 A 4/2012
(Continued)

*Primary Examiner* — Natalia A Gondarenko

(74) *Attorney, Agent, or Firm* — Lewis Roca Rothgerber Christie LLP

(57) ABSTRACT

A display device includes: a flexible substrate having a display area for displaying an image and a peripheral area outside the display area; a first pad electrode in the peripheral area of the flexible substrate; and a driver connected to the first pad electrode. The driver includes: a circuit board including a driving circuit; a second pad electrode on one side of the circuit board and facing the first pad electrode; a convex structure on one side of the second pad electrode and having an oval cross-section; and a bump electrode on one side of the convex structure and connected to the first pad electrode. The bump electrode includes a column covering the convex structure and a convex portion extending from one side of the column and protruding to the first pad electrode.

4 Claims, 5 Drawing Sheets

(51) Int. Cl.
*H01L 27/12* (2006.01)
*G02F 1/1333* (2006.01)
*G02F 1/1335* (2006.01)
*H01L 21/48* (2006.01)
*G02F 1/1345* (2006.01)
*G02F 1/1362* (2006.01)
*G02F 1/1368* (2006.01)

(52) U.S. Cl.
CPC .......... *H01L 23/4985* (2013.01); *H01L 24/11* (2013.01); *H01L 27/1214* (2013.01); *G02F 1/1368* (2013.01); *G02F 1/13452* (2013.01); *G02F 1/133305* (2013.01); *G02F 1/133514* (2013.01); *G02F 1/136286* (2013.01); *G02F 2201/121* (2013.01); *G02F 2201/123* (2013.01); *H01L 2224/10125* (2013.01); *H01L 2224/11011* (2013.01); *H01L 2224/11334* (2013.01); *H01L 2224/13019* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/13169* (2013.01)

(58) Field of Classification Search
CPC .............. H01L 23/4985; H01L 27/1214; H01L 27/3253; H01L 2224/16055; H01L 2224/16175; H01L 2224/13144; H01L 2224/13019; H01L 2224/10125; H01L 2924/163; H01L 2924/173; H01L 2924/183; H01L 2224/11334; H01L 2224/11011; H01L 2224/13124; H01L 2224/13155; H01L 2224/13164; H01L 2224/13169; H01L 2224/13139; H01L 2224/13147; H01L 24/81; H01L 2224/16012; H01L 2224/16104; H01L 2224/16238; H01L 2224/16057; H01L 2224/1147; H01L 2224/1146; H01L 2224/81359; H01L 2224/81379; H01L 23/3107; H01L 23/3121; H01L 23/315; H01L 23/3142; H01L 23/3192; H01L 27/124; H01L 27/14621; H01L 27/14623; H01L 27/3244; H01L 27/3248; H01L 27/326; H01L 27/3267; H01L 27/3272; H01L 27/3276; H01L 27/3286; H01L 2224/81902; H01L 2225/1058; H01L 2225/0652; H01L 2225/06517; G02F 1/13452; G02F 1/133514; G02F 1/136286; G02F 1/1368; G02F 1/133305; G02F 2201/121; G02F 2201/123; G02F 1/0107; G02F 1/133; G02F 1/1333; G02F 1/133345; G02F 1/133354; G02F 1/13336; G02F 1/133512; G02F 1/133519; G02F 1/133608; G02F 1/1339; G02F 1/136209; G02F 2001/136222; G02F 2202/50; G02F 2202/48; G02F 2202/104; H01J 2201/2825; H01J 2229/4875
USPC ........... 257/72, 737, 738, E23.069, E21.504; 438/107
See application file for complete search history.

(56) References Cited

U.S. PATENT DOCUMENTS

2013/0168856 A1* 7/2013 Wang .................... H01L 25/105
257/738
2017/0323863 A1* 11/2017 Lee .......................... H01L 24/11

FOREIGN PATENT DOCUMENTS

| KR | 10-1048829 B1 | 7/2011 |
|---|---|---|
| KR | 10-2013-0123720 A | 11/2013 |
| KR | 10-1570999 B1 | 11/2015 |

* cited by examiner

DISPLAY DEVICE AND MANUFACTURING METHOD THEREOF

CROSS-REFERENCE TO RELATED APPLICATION

This application claims priority to and the benefit of Korean Patent Application No. 10-2016-0089859, filed in the Korean Intellectual Property Office on Jul. 15, 2016, the entire content of which is incorporated herein by reference.

BACKGROUND

1. Field

Aspects of embodiments of the present invention relate to a display device and a manufacturing method thereof.

2. Description of the Related Art

A display device generally includes a substrate and a plurality of signal lines and thin film transistors disposed on the substrate. Further, a driver including an integrated circuit (IC) for generating various signals for driving the display device may be disposed in a region of the substrate.

The driver is mounted on the substrate by a non-conductive film (NCF). The driver is disposed on the substrate, and a bump electrode of the driver is connected to a pad electrode of the substrate to transmit a signal to a plurality of the signal lines disposed on the substrate.

When the driver is mounted through the non-conductive film, a contact error may occur between the driver and the pad electrode of the substrate due to, for example, a dimple on the bump electrode of the driver.

The above information disclosed in this Background section is for enhancement of understanding of the background of the present invention, and therefore, it may contain information that does not form prior art.

SUMMARY

Aspects of embodiments of the present invention have been made in an effort to stabilize contact between a driver and a substrate.

An exemplary embodiment of the present invention provides a display device including: a flexible substrate having a display area for displaying an image and a peripheral area disposed outside the display area; a first pad electrode in the peripheral area of the flexible substrate; and a driver connected to the first pad electrode. The driver includes a circuit board including a driving circuit, a second pad electrode on one side of the circuit board and facing the first pad electrode, a convex structure on one side of the second pad electrode and having an oval cross-section, and a bump electrode on one side of the convex structure and connected to the first pad electrode. The bump electrode includes a column covering the convex structure and a convex portion extending from one side of the column and protruding to the first pad electrode.

The convex structure may protrude to the first pad electrode.

The display device may further include a contact auxiliary electrode on the first pad electrode, and the convex portion may contact the contact auxiliary electrode.

The convex structure may include solder or a polymer material.

A cross-section of the column may be larger than a cross-section of the convex portion at where the convex portion and the column meet each other.

The display device may further include an auxiliary metal layer between the convex structure and the second pad electrode.

An edge of the column may contact the auxiliary metal layer.

Another embodiment of the present invention provides a method for manufacturing a display device. The method includes: forming a first flexible substrate comprising a first pad electrode; forming a driver; and mounting the driver on the first flexible substrate. The forming of the driver comprises: forming a second pad electrode on a side of a circuit board comprising a driving circuit; forming a photosensitive film pattern having an opening overlapping the second pad electrode on a side of the second pad electrode; forming a convex structure material layer in the opening, allowing the convex structure material layer to reflow to form a convex structure having an oval cross-section; forming a bump electrode in the opening, the bump electrode including a column covering the convex structure and a convex portion protruding from one side of the column; removing the photosensitive film pattern.

The mounting of the driver on the first flexible substrate may include connecting the bump electrode and the first pad electrode to each other.

According to exemplary embodiments of the present invention, a bump electrode of a driver has a convex portion so the contact between the driver and the substrate may be stabilized.

DETAILED DESCRIPTION

Figure 1:
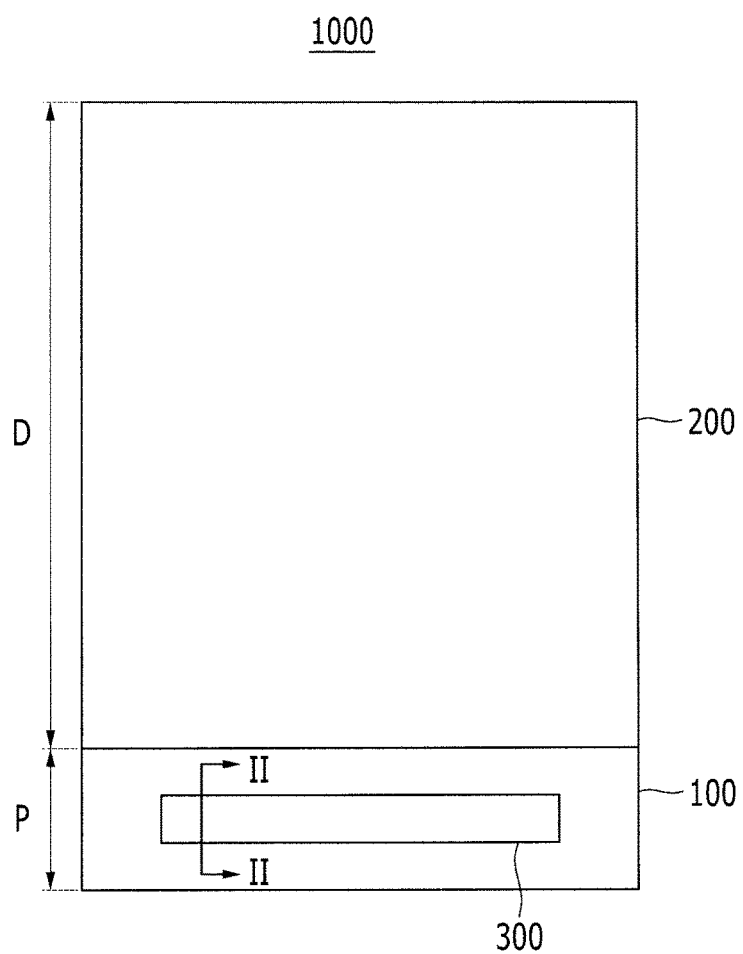
FIG. 1 illustrates a display device according to an exemplary embodiment of the present invention.

The present invention will be described more fully hereinafter with reference to the accompanying drawings, in which exemplary embodiments of the present invention are shown. As those skilled in the art would realize, the described embodiments may be modified in various different ways, all without departing from the spirit or scope of the present invention.

To more clearly describe features and aspects of the present invention, portions of the described embodiment thereof which do not relate to the description may be omitted, and like reference numerals designate like elements throughout the specification.

The size and thickness of each component shown in the drawings may be arbitrarily shown for better understanding and ease of description, and the present invention is not limited thereto. For example, in the drawings, the thickness of layers, films, panels, regions, etc., may be exaggerated for clarity.

It will be understood that when an element or layer is referred to as being "on," "connected to," or "coupled to"

another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. Further, unless explicitly described to the contrary, the terms "include" and "comprise," and variations such as "includes," "including," "comprises," and "comprising," will be understood to imply the inclusion of the stated elements but not the exclusion of any other elements.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

The phrase "on a plane" means viewing the object portion from a top thereof, and the phrase "on a cross-section" means viewing a cross-section of the object portion which is vertically cut from the side.

The driver and/or any other relevant devices or components according to embodiments of the present invention described herein may be implemented utilizing any suitable hardware, firmware (e.g., an application-specific integrated circuit), software, and/or a suitable combination of software, firmware, and hardware. For example, the various components of the driver may be formed on one integrated circuit (IC) chip or on separate IC chips. Further, the various components of the driver may be implemented on a flexible printed circuit film, a tape carrier package (TCP), a printed circuit board (PCB), or formed on a same substrate as the driver. Further, the various components of the driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device or the functionality of a particular computing device may be distributed across one or more other computing devices without departing from the scope of the exemplary embodiments of the present invention.

A display device according to an exemplary embodiment of the present invention will now be described, in detail, with reference to FIGS. 1 and 2.

FIG. 1 illustrates a display device according to an exemplary embodiment of the present invention. FIG. 2 shows a cross-section taken along the line II-II of FIG. 1.

Referring to FIG. 1, the display device 1000 includes a first substrate 100, a second substrate 200 facing the first substrate 100, and a driver 300.

The first substrate 100 and the second substrate 200 may be flexible substrates including a material having excellent heat resistance and durability, such as polyethylene naphthalate (PEN), polycarbonate (PC), polyarylate (PAR), polyether imide (PEI), polyether sulfone (PES), and/or polyimide (PI). Further, in some embodiments, the first substrate 100 and the second substrate 200 may include (or may be) flexible substrates made of various suitable flexible materials.

A plurality of thin film transistors, gate lines, data lines, and organic light emitting diodes may be disposed on the first substrate 100. The second substrate 200 is combined to (or coupled to) the first substrate 100 by a sealant to function as an encapsulation substrate.

Further, in other embodiments, a plurality of thin film transistors, gate lines, data lines, and pixel electrodes may be disposed on the first substrate 100, a plurality of color filters and one or more common electrodes may be disposed on the second substrate 200, and a liquid crystal layer may be disposed between the first substrate 100 and the second substrate 200. However, in some embodiments, the color filters and the common electrodes may be disposed on the first substrate 100.

The first substrate 100 includes a display area (D) for displaying images and a peripheral area (P) disposed on one edge of the display area (D). However, the positions of the display area (D) and the peripheral area (P) are variable in many different ways. FIG. 1 shows an exemplary embodiment in which the peripheral area (P) is disposed on a lower edge of the display area (D). In other embodiments, however, the peripheral area (P) may be disposed on the lower edge and a left edge of the display area (D). In such embodiments, the peripheral area (P) may have an L shape.

In other embodiments, the peripheral area (P) may be disposed to surround (e.g., to surround a periphery of) the display area (D).

The second substrate 200 is disposed in the display area (D) and does not overlap the driver 300 (e.g., the driver 300 is exposed outside of the second substrate 200). The driver 300 is disposed in the peripheral area (P) and is bonded to the first substrate 100 by a non-conductive film (NCF). The driver 300 receives a driving signal from the outside and transmits a driving signal corresponding to the received driving signal to the display area (D).

The driver 300 that is mounted on the first substrate 100 will now be further described with reference to FIG. 2.

Figure 2:
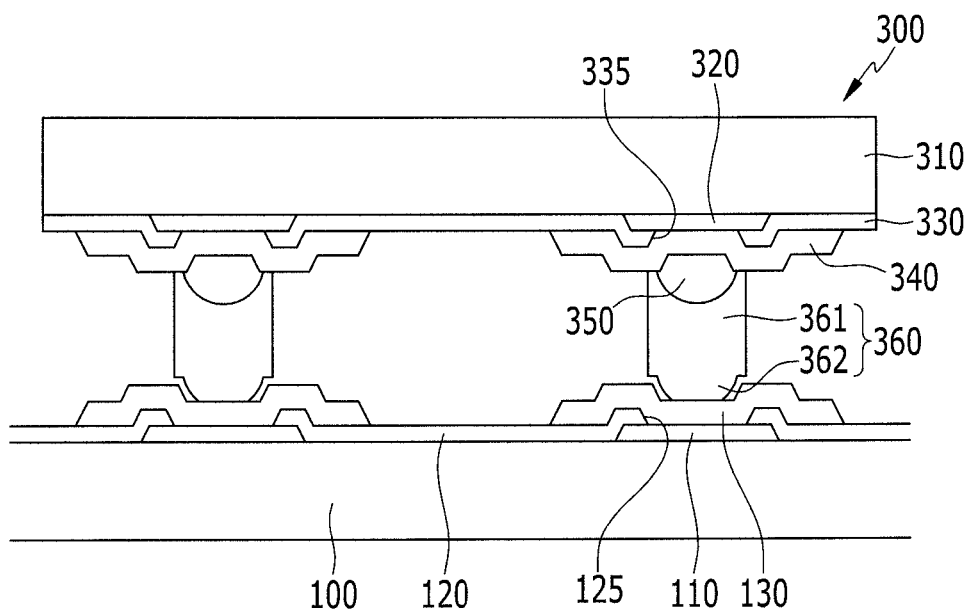
FIG. 2 shows a cross-section taken along the line II-II of FIG. 1.

Referring to FIG. 2, a first pad electrode 110, a first insulating layer 120, and a contact auxiliary electrode 130 are disposed on the first substrate 100. The contact auxiliary electrode 130 is connected to the first pad electrode 110 through a first contact opening 125 (e.g., a first contact hole) in the first insulating layer 120. The first pad electrode 110 and the contact auxiliary electrode 130 are disposed in the peripheral area (P).

The driver 300 includes a circuit board 310 including a driving circuit, a second pad electrode 320, a second insulating layer 330, an auxiliary metal layer 340, a convex structure 350, and a bump electrode 360.

The second pad electrode 320 is disposed on one side of the circuit board 310 and faces the first pad electrode 110. The second insulating layer 330 is disposed on the circuit board 310 and on one side of the second pad electrode 320.

The auxiliary metal layer 340 is disposed on one side of the second insulating layer 330 and is connected to the second pad electrode 320 through a second contact opening 335 (e.g., a second contact hole) in the second insulating layer 330.

The convex structure 350 is disposed on one side of the auxiliary metal layer 340 and overlaps the second pad electrode 320. The convex structure 350 has a convex shape protruding toward the first pad electrode 110 from the auxiliary metal layer 340 and has an oval cross-section. The convex structure 350 may include a conductive material, such as solder or a polymer material.

The bump electrode 360 is disposed on the auxiliary metal layer 340 and on one side of the convex structure 350. The bump electrode 360 includes a metal, such as gold (Au), copper (Cu), silver (Ag), platinum (Pt), palladium (Pd), nickel (Ni), or aluminum (Al).

The bump electrode 360 includes a column 361 and a convex portion 362. The column 361 covers the convex structure 350, and an edge of the column 361 contacts the auxiliary metal layer 340. The convex portion 362 extends from another edge of the column 361 and protrudes toward the first pad electrode 110. A cross-section of the column 361 is larger than (e.g., is wider than) a cross-section of the convex portion 362 at where the column 361 and the convex portion 362 meet each other (e.g., on a virtual border of the column 361 and the convex portion 362).

The convex portion 362 contacts the contact auxiliary electrode 130. A surface of the convex portion 362 that contacts the contact auxiliary electrode 130 may have a flat side. For example, the second pad electrode 320 of the driver 300 is connected to the first pad electrode 110 disposed on the first substrate 100 through the auxiliary metal layer 340, the bump electrode 360, and the contact auxiliary electrode 130. A driving signal applied to the driver 300 from the outside is transmitted to the display area (D) via the first pad electrode 110.

The convex structure 350 is a protrusion having an oval cross-section and is provided such that the bump electrode 360 disposed on one side of the convex structure 350 includes the protruding convex portion 362.

The presently-described exemplary embodiment has been described as including one convex portion 362 extending from the column 361, but in other embodiments, a plurality of the convex portions 362 may extend from the column 361. In these embodiments, a plurality of convex structures 350 are disposed (e.g., are disposed on the auxiliary metal layer 340), and each of the convex structures 350 may be disposed to correspond to one of the convex portions 362.

As described, the bump electrode 360 includes the convex portion 362 that contacts the contact auxiliary electrode 130, thereby preventing a dimple from being generated in the bump electrode 360 and increasing a contact area with the contact auxiliary electrode 130. Therefore, the driver 300 may stably contact the first substrate 100.

A method for manufacturing a display device according to an exemplary embodiment of the present invention will now be described with reference to FIGS. 1-7.

FIGS. 3-7 illustrate a method for manufacturing a driver according to an exemplary embodiment of the present invention.

The method for manufacturing a display device according to the presently-described exemplary embodiment includes providing a first substrate 100 (e.g., a first flexible substrate) and a second substrate 200 (e.g., a second flexible substrate), forming a driver 300, and mounting the driver 300 on the first substrate 100 (see, for example, FIG. 1). In such embodiments, the driver 300 is connected to a first pad electrode 110 disposed on the first substrate 100.

The process for forming the driver 300 and mounting the driver 300 on the first substrate 100 will now be described in further detail.

Figure 3:
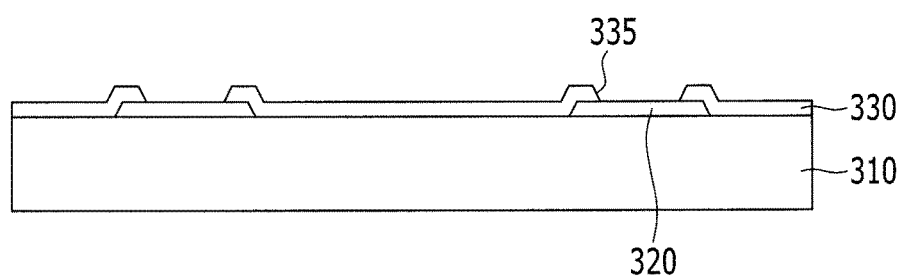
FIGS. 3-7 illustrate a method for manufacturing a driver according to an exemplary embodiment of the present invention.

Referring to FIG. 3, a second pad electrode 320 is formed on one side of a circuit board 310, and a second insulating layer 330 is formed on the circuit board 310 and the second pad electrode 320. A driving circuit is disposed on an opposite side of the circuit board 310 as the side on which the second pad electrode 320 is formed.

A second contact opening 335 overlapping the second pad electrode 320 is formed by etching part of (e.g., a portion of) the second insulating layer 330.

Figure 4:
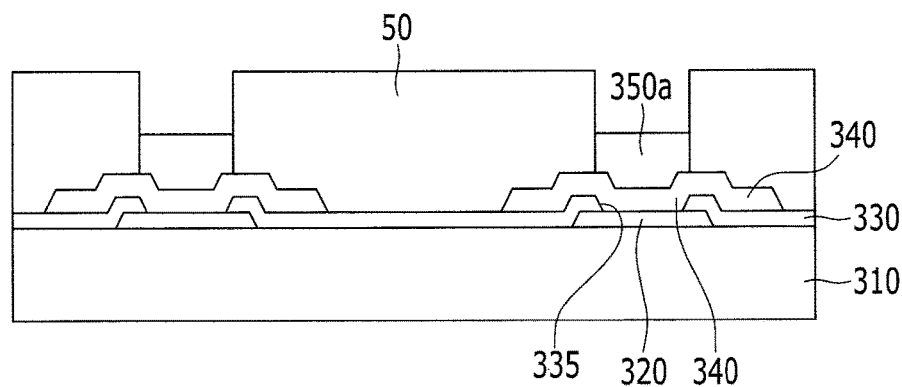

Referring to FIG. 4, an auxiliary metal layer 340 is formed on the second insulating layer 330. The auxiliary metal layer 340 is connected to the second pad electrode 320 through the second contact opening 335.

A photosensitive film pattern 50 is formed on the second insulating layer 330 and the auxiliary metal layer 340. The photosensitive film pattern 50 includes an opening for exposing part of (e.g., a portion of) the auxiliary metal layer 340. The opening in the photosensitive film pattern 50 overlaps the second pad electrode 320.

A convex structure material layer 350*a* (e.g., a convex structure forming material layer) is formed in the opening in the photosensitive film pattern 50. The convex structure material layer 350*a* may include solder or a polymer material.

Figure 5:
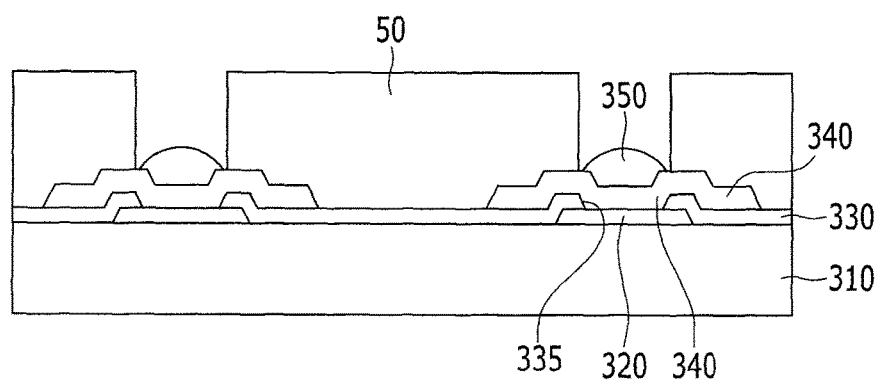

Referring to FIG. 5, a convex structure 350 is formed by allowing the convex structure material layer 350*a* to reflow. The convex structure 350 protrudes upward from the auxiliary metal layer 340 and has an oval cross-section. An edge of the convex structure 350 does not contact the opening in the photosensitive film pattern 50. For example, the edge of the convex structure 350 is separated from (e.g., spaced from) a side of the opening in the photosensitive film pattern 50 by a gap (e.g., a predetermined gap).

Figure 6:
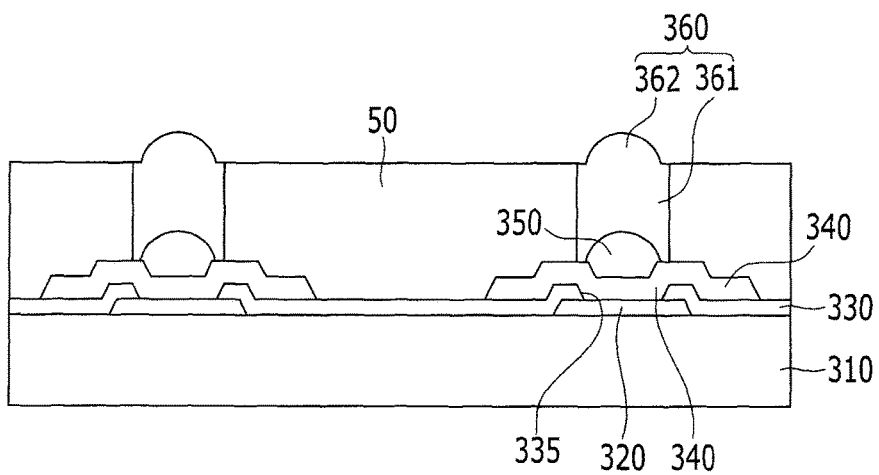

Referring to FIG. 6, a bump electrode 360 is formed in the opening in the photosensitive film pattern 50.

The bump electrode 360 includes a column 361 and a convex portion 362. The column 361 covers the convex structure 350 and a part (e.g., a portion) thereof contacts the auxiliary metal layer 340. The convex portion 362 protrudes from a top side of the column 361 to outside the opening in the photosensitive film pattern 50 due to the convex structure 350 disposed on a lower side of the column 361. A shape of a top side of the convex portion 362 corresponds to a shape of a top side of the convex structure 350.

An edge of the convex portion 362 is disposed inside the edge of the column 361. For example, an area of a bottom side of the convex portion 362 is smaller than an area of a top side of the column 361.

Figure 7:
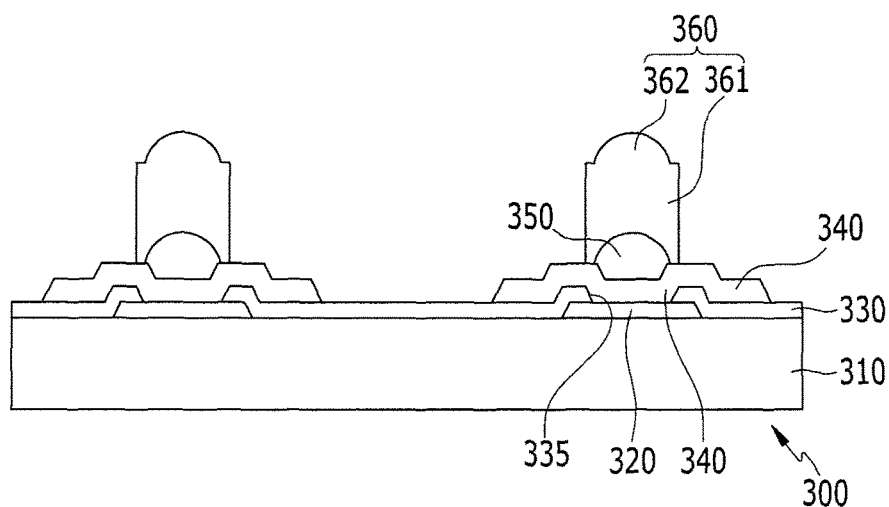

Referring to FIGS. 2 and 7, the photosensitive film pattern 50 is removed to manufacture the driver 300, and the driver 300 is mounted on the peripheral area (P) of the first substrate 100.

When the driver 300 is mounted on the first substrate 100, the bump electrode 360 is connected to the contact auxiliary electrode 130. For example, the convex portion 362 of the bump electrode 360 contacts the contact auxiliary electrode 130, and a part of (e.g., a portion of) the convex portion 362 that contacts the contact auxiliary electrode 130 may be made flat (e.g., may be flattened) due to a pressure formed when the driver 300 is mounted on the first substrate 100.

A display device according to another exemplary embodiment of the present invention will now be described with reference to FIG. 8.

Figure 8:
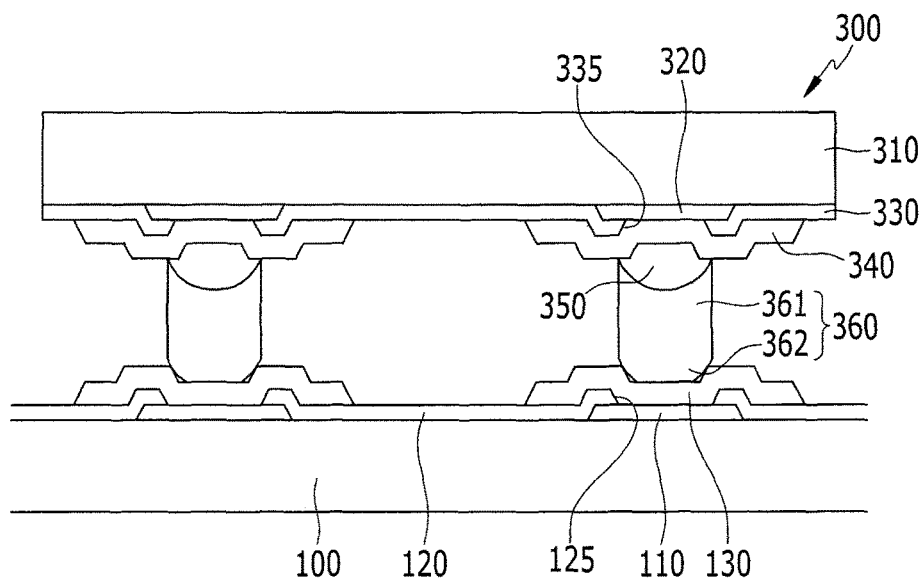
FIG. 8 shows a cross-section of a display device according to another exemplary embodiment of the present invention.

FIG. 8 shows a cross-section of a display device according to another exemplary embodiment of the present invention.

Referring to FIG. 8, elements of the display device according to the presently-described exemplary embodiment indicated by the same numerals as previously-described elements are the same or substantially the same as the previously-described elements and such elements may not be described again. The following description of the exemplary embodiment shown in FIG. 8 will primarily focus on different elements and/or configuration from the previously-described embodiments.

The bump electrode 360 includes a column 361 and a convex portion 362. The column 361 covers the convex structure 350. The convex portion 362 extends from one side of the column 361 and protrudes to (e.g., protrudes to contact) the first pad electrode 110. A cross-section of the column 361 corresponds to (e.g., has the same or substantially the same size as) a cross-section of the convex portion 362 at where the column 361 and the convex portion 362 meet each other (e.g., at a virtual border of the column 361 and the convex portion 362).

The convex structure 350 is disposed on one side of the auxiliary metal layer 340 and overlaps the second pad electrode 320. The convex structure 350 protrudes toward the first pad electrode 110 from the auxiliary metal layer 340 and has an oval cross-section. The convex structure 350 may include a conductive material, such as solder.

Accordingly, the second pad electrode 320 of the driver 300 is connected to the first pad electrode 110 disposed on the first substrate 100 through the auxiliary metal layer 340, the bump electrode 360, and the contact auxiliary electrode 130. Therefore, a driving signal applied to the driver 300 from the outside is transmitted to the display area (D) via the first pad electrode 110.

While the present invention has been described in connection with what are presently considered to be practical exemplary embodiments, it is to be understood that the present invention is not limited to the disclosed embodiments and is intended to cover various modifications and equivalent arrangements included within the spirit and scope of the appended claims and their equivalents.

What is claimed is:

1. A display device comprising:
    a flexible substrate having a display area for displaying an image and a peripheral area outside the display area;
    a first pad electrode in the peripheral area of the flexible substrate; and
    a driver connected to the first pad electrode, the driver comprising:
        a circuit board comprising a driving circuit;
        a second pad electrode on one side of the circuit board and facing the first pad electrode;
        an auxiliary metal layer on one side of the second pad electrode;
        a convex structure on one side of the auxiliary metal layer and having an oval cross-section, the convex structure comprising a polymer material; and
        a bump electrode on one side of the convex structure and connected to the first pad electrode, the bump electrode comprising a column covering the convex structure and a convex portion extending from one side of the column and protruding to the first pad electrode,
    wherein both an edge of the column and the convex structure contact the auxiliary metal layer.

2. The display device of claim 1, wherein the convex structure protrudes to the first pad electrode.

3. The display device of claim 2, further comprising a contact auxiliary electrode on the first pad electrode,
    wherein the convex portion contacts the contact auxiliary electrode.

4. The display device of claim 3, wherein a cross-section of the column is larger than a cross-section of the convex portion at where the convex portion and the column meet each other.

* * * * *